United States Patent [19]

Watanabe et al.

[11] Patent Number: 4,922,218

[45] Date of Patent: May 1, 1990

[54] PHOTOVOLTAIC DEVICE

[75] Inventors: Kaneo Watanabe, Kyoto; Masayuki Iwamoto, Hyogo; Koji Minami, Osaka, all of Japan

[73] Assignee: Sanyo Electric Co., Ltd., Osaka, Japan

[21] Appl. No.: 241,004

[22] Filed: Sep. 2, 1988

[30] Foreign Application Priority Data

Sep. 14, 1987 [JP] Japan ................................ 62-229982

[51] Int. Cl.[5] ..................... H01L 27/14; H01L 45/00; H01L 29/161

[52] U.S. Cl. .......................................... 357/30; 357/2; 357/16; 357/90

[58] Field of Search ................ 357/30 K, 30 L, 2, 16, 357/30 D, 30 F, 90

[56] References Cited

U.S. PATENT DOCUMENTS

| | | | |
|---|---|---|---|
| 4,322,253 | 3/1982 | Pankove et al. | 148/1.5 |
| 4,514,582 | 4/1985 | Tiedje et al. | 136/256 |
| 4,532,537 | 6/1985 | Kane | 357/30 |
| 4,556,790 | 12/1985 | Glass et al. | 250/211 J |
| 4,719,501 | 1/1988 | Nakagawa et al. | 357/59 |
| 4,724,323 | 2/1988 | Fukuya et al. | 250/370 |
| 4,726,851 | 2/1988 | Matsumura et al. | 136/258 |

*Primary Examiner*—Martin H. Edlow
*Assistant Examiner*—Stephen D. Meier
*Attorney, Agent, or Firm*—Darby & Darby

[57] ABSTRACT

A photovoltaic device comprises a photoactive layer for generating carriers when light is applied thereto, and a window layer containing at least silicon and hydrogen and provided on the light incidence side of the photoactive layer. Hydrogen concentration in the window layer is higher in the layer's light incidence side than in the side facing the photoactive layer. Thus, the light incidence side of the window layer has a rough surface.

25 Claims, 1 Drawing Sheet

PHOTOVOLTAIC DEVICE

BACKGROUND OF THE INVENTION

1. Field of the invention

The present invention relates to photovoltaic devices and particularly to a photovoltaic device having a high photoelectric conversion efficiency, which can be manufactured at a low cost.

2. Description of the Prior Art

U.S. Pat. No. 4,281,208, for example, discloses a photovoltaic device having a laminated structure in which a light incident electrode, an amorphous semiconductor film including a photoactive layer for receiving light and generating carriers, and a back plate electrode are placed one upon another in this order on a transparent substrate of glass or the like. Such a photovoltaic device using an amorphous semiconductor film for a photoactive layer has a reduced manufacturing cost for a unit quantity of generated energy compared with a photovoltaic device using a single crystal wafer; however, it has a low photoelectric conversion efficiency.

In a photovoltaic device described by S. Nakano et al. in Technical Digest of International PVSEC-1 (1984), pp. 583-586, an amorphous semiconductor film including a photoactive layer is formed on a light acceptance electrode having a rough surface texture, whereby incident light is confined within the semiconductor film, which makes it possible to improve the photoelectric conversion efficiency.

In general, a light acceptance electrode comprises a single layer or multiple layers of transparent conductive oxide (TCO) such as tin indium oxide or tin oxide. Such a TCO electrode is formed on a transparent substrate of glass or the like, mainly by a thermal CVD process. On that occasion, the substrate needs to be maintained at a high temperature of about 500° C. in order to ensure a sufficient transparency for the TCO electrode and accordingly a large quantity of electric energy is required. As a result, the manufacturing cost of the TCO electrode is higher than the manufacturing cost for other films, which makes it difficult to reduce the manufacturing cost per a unit quantity of generated energy in a photovoltaic device.

SUMMARY OF THE INVENTION

In view of the above described prior art, an object of the present invention is to provide a photovoltaic device having a high photoelectric conversion efficiency and a reduced manufacturing cost.

According to an aspect of the present invention, a photovoltaic device comprises a photoactive layer for generating carriers upon receipt of light, and a window layer including at least silicon and hydrogen and located on the light incidence side of the photoactive layer, hydrogen concentration in the window layer being higher in the light incidence side portion than that in the portion facing the photoactive layer.

According to another aspect of the present invention, a photovoltaic device comprises an opaque conductive substrate having a flat surface, a photoactive layer formed on the opaque substrate to generate carriers upon receipt of light, and a window layer formed on the photoactive layer. The window layer includes a first sub-layer on its light incidence side and a second sub-layer on its photoactive layer side, the light incidence side surface of the first sub-layer being rougher than light incidence side surface of the second sub-layer.

In the photovoltaic device, incident light passes through the first sub-layer and the second sub-layer and reaches the photoactive layer. The photoactive layer absorbs the incident light and forms photo-generated carriers of electron-hole pairs. The electrons are collected on the conductive surface of the substrate. The holes are collected in the second sub-layer having a high conductivity. Thus, electrical energy may be taken out from the conductive surface of a substrate and from the second sub-layer.

On the other hand, light not absorbed in the photoactive layer is reflected on the reflective surface of the substrate and again reaches the photoactive layer where it is partially absorbed to generate carriers. Part of the reflected light from the substrate, not absorbed by the photoactive layer, is reflected in an irregular manner from the rough surface of the first sub-layer and again reaches the photoactive layer. Thus, most of the light once having entered the first sub-layer is confined until it is absorbed by the photoactive layer, whereby a high photoelectric conversion efficiency can be obtained. In addition, since the photovoltaic device of the invention does not require a conventional TCO electrode, the manufacturing cost can be reduced.

According to a further aspect of the present invention, a photovoltaic device comprises a transparent substrate having a flat surface, a window layer formed on the transparent substrate, and a photoactive layer formed on the window layer to generate carriers upon receipt of light. The window layer includes a first sub-layer on its substrate side and a second sub-layer on its photoactive layer side, the side of the first sub-layer facing the second sub-layer being rougher than the other surface thereof facing the substrate. A reflective electrode is formed on the photoactive layer.

A high photoelectric conversion efficiency can be obtained since the light incident on the transparent substrate is confined between the rough surface and the reflective metal electrode. In addition, the photovoltaic device does not require a conventional TCO electrode and thus the manufacturing cost can be reduced.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
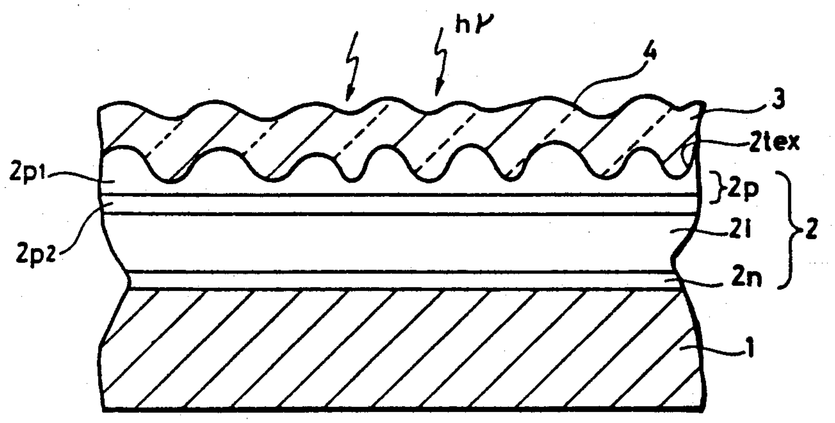
FIG. 1 is a sectional view schematically illustrating a photovoltaic device according to an embodiment of the present invention.

Referring to FIG. 1, a photovoltaic device according to an embodiment of the present invention comprises a substrate 1 having a light reflecting conductive surface. The substrate 1 may be formed of a light reflecting metal such as stainless steel or aluminum, or it may be formed by coating a light reflecting metal on a surface of an insulator substrate material of glass or other ceramics. A semiconductor film 2 formed on the substrate 1 is mainly composed of hydrogenated amorphous silicon (a-Si:H). The semiconductor film 2 includes an n type ohmic layer 2n for forming an ohmic contact with the conductive surface of the substrate 1. The semiconductor film 2 further includes a photoactive layer 2i which is non-doped or contains a conductivity type determining impurity of an extremely low concentration, and the photoactive layer 2i generates carriers of electron-hole pairs when it receives light. The semiconductor film 2 further includes a p type window layer 2p for admitting incidence of light onto the photoactive layer 2i.

The window layer 2p includes a first sub-layer $2_{p1}$ on its light incidence side and a second sub-layer $2_{p2}$ on its photoactive layer side. The second sub-layer $2_{p2}$ contains hydrogen of about 15 at. %, while the first sub-layer $2_{p1}$ contains hydrogen of about 20 at. % or more. The increase in the content of hydrogen causes the surface of the first sub-layer to become rough and have a textured structure.

For example, the surface of the first sub-layer $2_{p1}$ of a-Si:H is almost flat with the content of hydrogen of less than about 15 at. %. When the content of hydrogen becomes 15 at. % or more, the surface of the first sub-layer $2_{p1}$ is caused to have unevenness. The averaged periodicity of the unevenness on the first sub-layer $2_{p1}$ is about 2000 to 3000 Å with the content of hydrogen of 20 at. % and 2500 to 6000 Å with the content of hydrogen of 25 at. % and it is 3000 Å to 1 μm with the content of hydrogen of 30 at. %.

The averaged periodicity of the unevenness on the first sub-layer of hydrogenated amorphous silicon carbide (a-SiC:H) is 2000 to 5000 Å with the content of hydrogen of 25 at. % and 3000 Å to 2 μm with the content of hydrogen of 30 at. %. Also, in the first sub-layer of hydrogenated amorphous silicon nitride (a-SiN:H), hydrogenated microcrystalline silicon (μc-Si:H) or hydrogenated microcrystalline silicon carbide (μc-SiC:H), the surface unevenness increases according to increase in the content of hydrogen.

On the other hand, the second sub-layer $2_{p2}$ in contact with the photoactive layer 2i has a higher conductivity than that of the first sub-layer $2_{p1}$. The conductivity of the second sub-layer $2_{p2}$ is almost equal to that of a conventional TCO electrode and it is desired to be $1\times10^{2}\Omega^{-1}cm^{-1}$ or more. The second sub-layer $2_{p2}$ having such a high conductivity may be formed by μc-SiC:H heavily doped with p type impurity.

The following table briefly indicates an example of compositions and manufacturing conditions of the semiconductor film 2.

| | Composition | Manufacturing method | Reaction conditions |
|---|---|---|---|
| 1st sub-layer | a-SiC:H | Parallel flat plate type glow discharge | $SiH_4$ = 10 sccm, RF power 1 W $B_2H_6$/$SiH_4$ = 0.3% Substrate temperature 100° C. $CH_4$ = 10 sccm, Pressure 1 Torr |
| 2nd sub-layer | μc-SiC:H | Electron cyclotron resonance discharge | $SiH_4$ = 2 sccm, Microwave power 20 W $B_2H_6$/$SiH_4$ = 0.3%, Substrate temperature 250° C. Ar = 100 sccm, Pressure 5 m Torr $H_2$ = 100 sccm $CH_4$ = 2 sccm |

-continued

| | Composition | Manufacturing method | Reaction conditions |
|---|---|---|---|
| Photo-active layer | a-Si:H | Parallel flat plate type glow discharge | $SiH_4$ = 2 sccm. RF power 2 W Substrate temperature 200° C. Pressure 100 m Torr |
| Ohmic layer | a-Si:H | Parallel flat plate type glow discharge | $SiH_4$ = 2 sccm. RF power 2 W $PH_3$/$SiH_4$ = 1%. Substrate temperature 200° C. $H_2$ = 2 sccm. Pressure 100 m Torr |

The first sub-layer of a-SiC:H containing a high concentration of hydrogen can be also formed by microwave discharge in which current for a magnetic field in electron cyclotron resonance (ECR) discharge is set to 0. In this case, the first sub-layer is formed under reaction conditions of $SiH_4$=10 sccm, $B_2H_6/SiH_4$=0.3 %, $CH_4$=10 sccm, microwave power of 1 W, a substrate temperature of 100° C. and a pressure of 50 mTorr.

The n type ohmic layer 2n, the photoactive layer 2i, the second sub-layer $2_{p2}$ having the high conductivity, and the first sub-layer $2_{p1}$ having a rough surface texture 2tex are deposited successively on the substrate 1 having a light reflecting conductive surface, and after that, a well-known transparent antireflective film 3 is deposited on the surface 2tex of the first sub-layer $2_{p1}$. The antireflective film 3 may be formed of $SiO_2$ or acrylic resin.

In the photovoltaic device in FIG. 1, light h ν falling from the air onto the antireflective film 3 is hardly reflected on its free surface 4. Most of the light entering the antireflective film 3 directly passes through the first sub-layer $2_{p1}$ and the second sub-layer $2_{p2}$ and reaches the photoactive layer 2i. The photoactive layer 2i absorbs the incident light and forms photo-generated carriers of electron-hole pairs. The electrons are collected on the conductive surface of the substrate 1 due to junction field formed by the window layer 2p, the photoactive layer 2i and the ohmic layer 2n, and the holes are collected in the second sub-layer $2_{p2}$ having the high conductivity. Thus, electric energy is taken from the conductive surface of the substrate 1 and the second sub-layer $2_{p2}$ to outside On the other hand, the light not absorbed by the photoactive layer 2i and transmitted through the ohmic layer 2n is reflected on the reflective surface of the substrate 1 and reaches again the photoactive layer 2i, where it is absorbed to generate carriers. Part of reflected light from the substrate 1, not absorbed by the photoactive layer 2i is irregularly reflected on the rough surface 2tex and reaches again the photoactive layer 2i.

Thus, most of the light once having entered the semiconductor film 2 is confined within the semiconductor film 2 until it is absorbed by the photoactive layer 2i, whereby a high photoelectric conversion efficiency can be obtained. In addition, since the photovoltaic device of the invention does not require a conventional TCO electrode, the manufacturing cost can be reduced.

Figure 2:
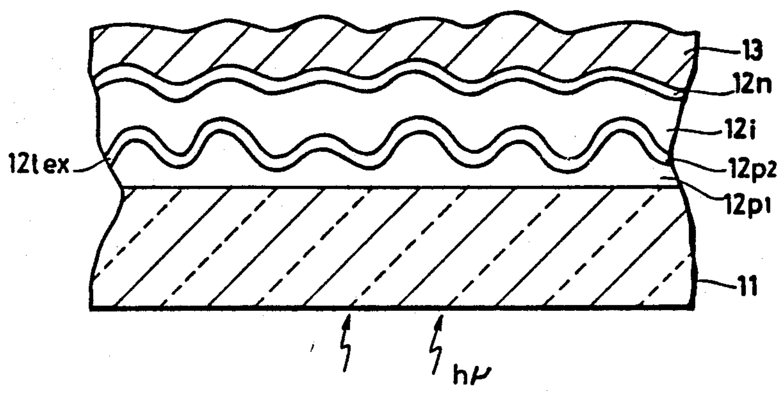
FIG. 2 is a sectional view schematically showing a photovoltaic device according to another embodiment of the invention.

Referring to FIG. 2, a photovoltaic device according to another embodiment of the invention comprises a transparent insulator substrate 11 of glass or the like. A first sub-layer $12_{p1}$ containing a large quantity of Si—$H_2$ bonding and having a rough surface texture 12tex is deposited on the substrate 11, and a second sub-layer $12_{p2}$ having a high conductivity to function as a collector electrode is deposited on the rough surface 12tex. Further, a photoactive layer $12i$ and an ohmic layer $12n$ are deposited on the second sub-layer $12_{p2}$ and finally a back plate electrode 13 of a metal of high reflectivity such as aluminum or silver is deposited.

Also in the photovoltaic device of FIG. 2, a high photoelectric conversion efficiency can be obtained since the light $h\nu$ incident on the transparent substrate 11 is confined between the rough surface 12tex and the reflective metal electrode 13. In addition, the photovoltaic device of FIG. 2 does not require a conventional TCO electrode either and thus the manufacturing cost can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device comprising a photoactive layer for generating optical carriers when light is applied thereto, and a window layer containing at least silicon and hydrogen and located on a light incidence side of said photoactive layer, wherein hydrogen concentration in said window layer is higher in a portion on a light incidence side than in a portion facing said photoactive layer.

2. A photovoltaic device in accordance with claim 1, wherein conductivity of said window layer is higher in the portion facing said photoactive layer than in the portion on the light incidence side.

3. A photovoltaic device in accordance with claim 2, wherein the conductivity of photoactive layer side portion of said window layer is $1\times10^2\Omega^{-1}cm^{-1}$ or more.

4. A photovoltaic device in accordance with claim 1, wherein said window layer is formed of a material selected from a group consisting of hydrogenated amorphous silicon, hydrogenated silicon carbide, hydrogenated amorphous silicon nitride, hydrogenated microcrystalline silicon and hydrogenated microcrystalline silicon carbide.

5. A photovoltaic device in accordance with claim 1, wherein hydrogen concentration in the light incidence side of said window layer is 20 at. % or more.

6. A photovoltaic device in accordance with claim 5, wherein the hydrogen concentration in the light incidence side of said window layer is 25 at. % or more.

7. A photovoltaic device in accordance with claim 6, wherein the hydrogen concentration in the light incidence side of said window layer is 30 at. % or more.

8. A photovoltaic device in accordance with claim 1, wherein said window layer is formed of a p type semiconductor.

9. A photovoltaic device comprising:

an opaque substrate having a flat surface, a photoactive layer formed on said flat surface to generate optical carriers when light is applied thereto, and a transparent semiconductor window layer formed on said photoactive layer, said window layer including a first sub-layer on the light incidence side of said window layer and a second sub-layer facing said photoactive layer, the light incidence surface of said first sub-layer being rougher than the light incidence surface of said second sub-layer, one said sub-layer serving as a conductor for current flow from the device.

10. A photovoltaic device in accordance with claim 9, wherein conductivity of said second sub-layer is higher than that of said first sub-layer.

11. A photovoltaic device in accordance with claim 10, wherein the conductivity of said second sub-layer is $1\times10^2\Omega^{-1}cm^{-1}$.

12. A photovoltaic device in accordance with claim 9, wherein said window layer is formed of a material selected from a group consisting of hydrogenated amorphous silicon, hydrogenated silicon carbide, hydrogenated amorphous silicon nitride, hydrogenated microcrystalline silicon and hydrogenated microcrystalline silicon carbide.

13. A photovoltaic device in accordance with claim 9, wherein an averaged periodicity of unevenness on the light incidence side surface of said first sub-layer is 2000 Å or more.

14. A photovoltaic device in accordance with claim 13, wherein the averaged periodicity of unevenness on the light incidence side surface of said first sub-layer is 2500 Å or more.

15. A photovoltaic device in accordance with claim 14, wherein the averaged periodicity of unevenness on the light incidence side surface of said first sub-layer is 3000 Å or more.

16. A photovoltaic device in accordance with claim 9, wherein said window layer is formed of a p type semiconductor.

17. A photovoltaic device in accordance with claim 9, wherein an antireflective film is provided on said first sub-layer.

18. A photovoltaic device comprising a transparent substrate having a flat surface, a transparent semiconductor window layer formed on said flat surface, and a photoactive layer formed on said window layer to generate optical carriers when light is applied thereto, said window layer including a first sub-layer facing said substrate and a second sub-layer facing said photoactive layer, the surface of said first sub-layer facing said second sub-layer being rougher than the other surface of said first sub-layer facing said substrate, one said sub-layer serving as a conductor for current flow from the device.

19. A photovoltaic device in accordance with claim 18, wherein conductivity of said second sub-layer is higher than that of said first sub-layer.

20. A photovoltaic device in accordance with claim 19, wherein the conductivity of said second sub-layer is $1\times10^2\Omega^{-1}cm^{-1}$ or more.

21. A photovoltaic device in accordance with claim 18, wherein said window layer is formed of a material selected from a group consisting of hydrogenated amorphous silicon, hydrogenated silicon carbide, hydrogenated amorphous silicon nitride, hydrogenated microcrystalline silicon and hydrogenated microcrystalline silicon carbide.

22. A photovoltaic device in accordance with claim 18, wherein an averaged periodicity of unevenness on the second sub-layer side surface of said first sub-layer is 2000 Å or more.

23. A photovoltaic device in accordance with claim 22, wherein the averaged periodicity of unevenness on the second sub-layer side surface of said first sub-layer is 2500 Å or more.

24. A photovoltaic device in accordance with claim 23, wherein the averaged periodicity of unevenness on the second sub-layer side surface of said first sub-layer is 3000 Å or more.

25. A photovoltaic device in accordance with claim 18, wherein said window layer is formed of a p type semiconductor.

* * * * *